(12) United States Patent
Mitsuhashi

(10) Patent No.: US 9,257,369 B2
(45) Date of Patent: Feb. 9, 2016

(54) SEMICONDUCTOR DEVICE HAVING A BASE FILM AND MANUFACTURING METHOD FOR SAME

(71) Applicant: ROHM CO., LTD., Kyoto (JP)

(72) Inventor: Toshiro Mitsuhashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/172,287

(22) Filed: Feb. 4, 2014

(65) Prior Publication Data

US 2014/0225266 A1 Aug. 14, 2014

(30) Foreign Application Priority Data

Feb. 8, 2013 (JP) .................. 2013-023569

(51) Int. Cl.
*H01L 23/495* (2006.01)
*H01L 23/48* (2006.01)
*H01L 21/768* (2006.01)
*H01L 23/00* (2006.01)

(52) U.S. Cl.
CPC ........ *H01L 23/481* (2013.01); *H01L 21/76898* (2013.01); *H01L 24/29* (2013.01); *H01L 24/81* (2013.01); *H01L 24/97* (2013.01); *H01L 2224/13* (2013.01); *H01L 2924/15311* (2013.01)

(58) Field of Classification Search
CPC ............ H01L 23/481; H01L 23/76898; H01L 2224/13; H01L 2924/15311; H01L 24/29; H01L 24/81; H01L 24/97

USPC .................................................. 257/673, 737
See application file for complete search history.

(56) References Cited

U.S. PATENT DOCUMENTS

| | | | | |
|---|---|---|---|---|
| 5,426,266 A | * | 6/1995 | Brown et al. | 174/267 |
| 8,299,624 B2 | | 10/2012 | Matsuo | |
| 8,637,986 B2 | * | 1/2014 | Masuda et al. | 257/739 |
| 2001/0011777 A1 | * | 8/2001 | Kano | 257/781 |
| 2003/0045085 A1 | * | 3/2003 | Taniguchi et al. | 438/618 |
| 2011/0089571 A1 | * | 4/2011 | Matsuo | 257/774 |
| 2014/0113411 A1 | * | 4/2014 | Masuda et al. | 438/108 |

FOREIGN PATENT DOCUMENTS

| | | |
|---|---|---|
| JP | 2011-086773 A | 4/2011 |
| JP | 2011-086850 A | 4/2011 |

* cited by examiner

*Primary Examiner* — Nicholas Tobergte
(74) *Attorney, Agent, or Firm* — Rabin & Berdo, P.C.

(57) ABSTRACT

The present invention is directed to a semiconductor device including a semiconductor substrate, a through hole penetrating the semiconductor substrate, a base film covering the through hole, a conductive layer disposed on the base film, an insulating film formed on the side wall of the through hole, and a conductive material embedded in the through hole via the insulating film, in which the base film has a stepped portion formed by an opening pattern that selectively exposes the conductive layer therethrough into the through hole, and in which the conductive material is connected electrically to the conductive layer through the opening pattern.

12 Claims, 16 Drawing Sheets

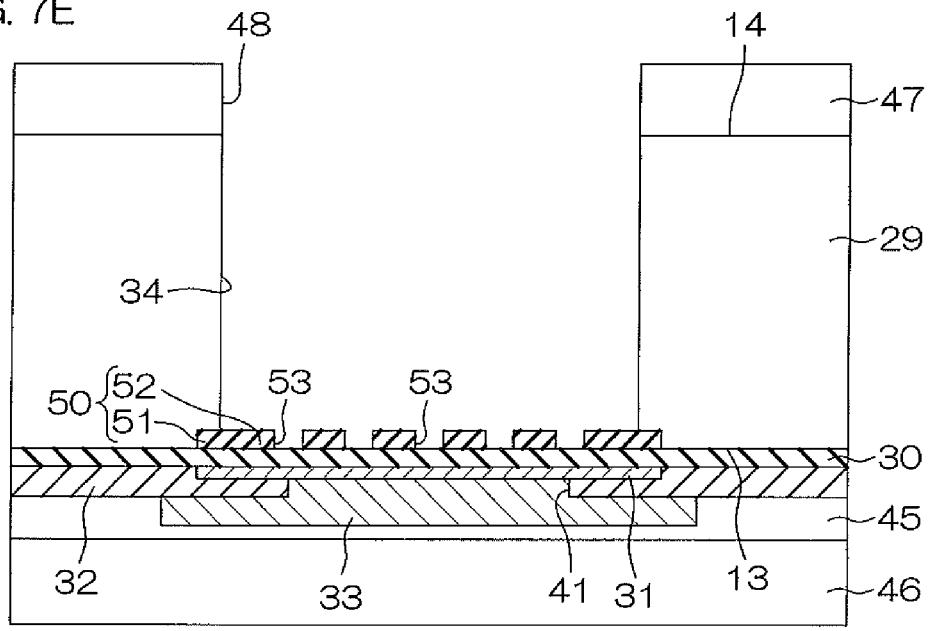
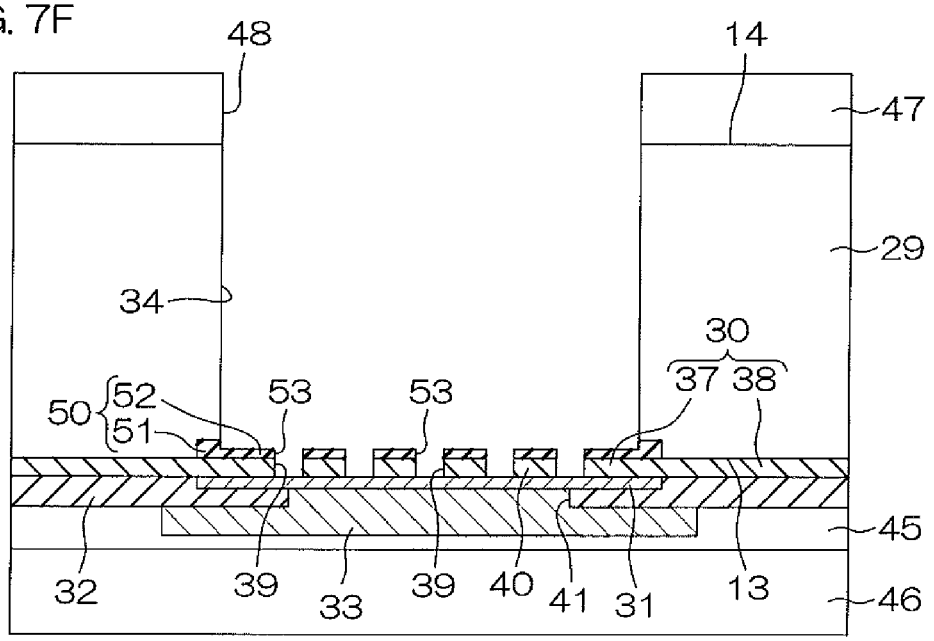

SEMICONDUCTOR DEVICE HAVING A BASE FILM AND MANUFACTURING METHOD FOR SAME

CROSS-REFERENCE TO RELATED APPLICATION

This application corresponds to Japanese Patent Application No. 2013-23569 filed with the Japan Patent Office on Feb. 8, 2013, the entire disclosure of which is incorporated herein by reference.

FIELD OF THE INVENTION

The present invention relates to a semiconductor device having a through electrode and a method for manufacturing such a semiconductor device.

BACKGROUND ART

Recently, there have been developed techniques in which multiple semiconductor devices each having a through electrode are stacked to form a small, high-capacity, and highly-functional electronic component. Semiconductor devices having a through electrode are disclosed in, for example, Patent Document 1 (Japanese Unexamined Patent Publication No. 2011-86773) and Patent Document 2 (Japanese Unexamined Patent Publication No. 2011-86850).

The semiconductor devices disclosed in Patent Documents 1 and 2 include a silicon substrate, a through electrode provided in the silicon substrate, an electrode pad formed on a surface of the silicon substrate, and a rearrangement wiring layer formed on the electrode pad. Such semiconductor devices are manufactured by, for example, the following method. First, an electrode pad is formed on a front surface of a silicon substrate via an insulating film to form a rearrangement wiring layer. Next, a first etching gas ($SF_6$) is used to perform dry etching on a rear surface of the silicon substrate to the middle of the silicon substrate. Subsequently, a second etching gas ($C_4F_8$) is used to perform dry etching on the remaining part of the silicon substrate to thereby form a through hole that reaches the electrode pad. An insulating film is then formed on the entire inner surface of the through hole and, thereafter, the insulating film at the bottom surface of the through hole is etched to provide communication between the electrode pad and the through hole. A through electrode is then formed inside the insulating film. A semiconductor device having a through electrode is thus obtained through such a process.

BRIEF SUMMARY OF THE INVENTION

However, in such methods disclosed in Patent Documents 1 and 2 in which an insulating film is formed in the entire inner surface of a through hole and then the insulating film at the bottom surface of the through hole is etched to provide communication between the electrode pad and the through hole, the insulating film on the side wall of the through hole may undergo a reduction in the insulating performance due to damage to the insulating film and/or a reduction in the thickness thereof during the etching.

It is hence an object of the present invention to realize a semiconductor device achieving reliability higher than conventional devices and a method for manufacturing such a semiconductor device in which an insulating film on the side wall of a through hole can be prevented from undergoing a reduction in the insulating performance.

BRIEF DESCRIPTION OF THE DRAWINGS

FIGS. 7A to 7J show a sequence of steps of a part of a process for manufacturing the arithmetic chip shown in FIG. 6.

DETAILED DESCRIPTION OF THE INVENTION

Figure 1:
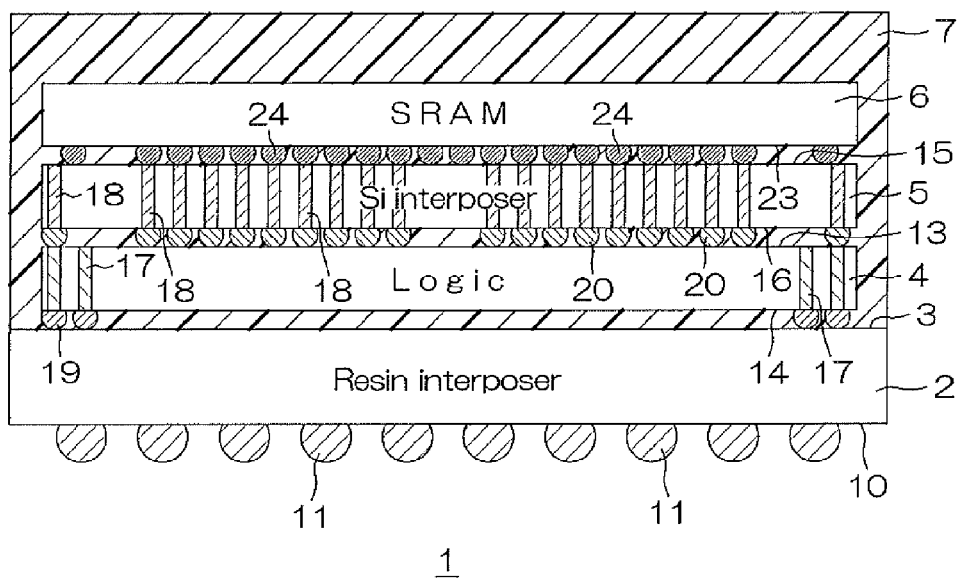
FIG. 1 is a schematic cross-sectional view of an electronic component according to an embodiment of the present invention.

The present invention is directed to a semiconductor device including a semiconductor substrate, a through hole penetrating the semiconductor substrate, a base film covering the through hole, a conductive layer disposed on the base film, an insulating film formed on the side wall of the through hole, and a conductive material embedded in the through hole via the insulating film, in which the base film has a stepped portion formed by an opening pattern that selectively exposes the conductive layer therethrough into the through hole, and in which the conductive material is connected electrically to the conductive layer through the opening pattern.

The semiconductor device can be manufactured by, for example, a semiconductor device manufacturing method according to the present invention.

The method includes the steps of forming a base film on a front surface of a semiconductor substrate, forming a conductive layer on the base film, forming a through hole penetrating the semiconductor substrate from a rear surface of the semiconductor substrate to reach the base film at the bottom portion, forming a stepped portion in the base film by forming in the base film an opening pattern that selectively exposes the conductive layer therethrough, after forming the stepped portion, forming an insulating film by depositing insulating material in the through hole from the rear surface side of the semiconductor substrate, exposing the conductive layer selectively through the opening pattern by selectively etching the insulating film at the bottom portion of the through hole, and embedding conductive material in the through hole via the insulating film to connect the conductive material electrically to the conductive layer through the opening pattern.

In accordance with the method above, the stepped portion is formed in the base film at the bottom portion of the through hole before depositing the insulating material in the through hole to form the insulating film (side wall insulating film) covering the side wall of the through hole. As a result, source gas for the insulating material is less likely to enter the opening pattern at the stepped portion at the bottom portion of the through hole, whereby the insulating film at the bottom portion can have a thickness smaller than in the case where no stepped portion is provided at the bottom portion of the through hole. This can shorten the time required to selectively etch the insulating film at the bottom portion of the through hole to expose the conductive layer. Accordingly, the side wall insulating film is less likely to be etched by the etching gas and the film quality is less likely to deteriorate due to etching damage. As a result, the side wall insulating film of the through hole can be prevented from undergoing a reduction in the insulating performance, whereby it is possible to realize a semiconductor device achieving reliability higher than conventional devices.

The opening pattern may be formed with one opening or multiple openings.

The semiconductor device may further include a second film provided between the semiconductor substrate and the base film and having an opening pattern in communication with the opening pattern of the base film.

In this case, the second film may be thinner than the base film. The semiconductor device may further include an embedded insulating film embedded selectively in a surface of the semiconductor substrate and formed integrally with the second film.

The opening pattern may be formed in a striped manner in the base film.

The opening pattern in the base film may have an aspect ratio of 1 to 3.

The opening pattern in the base film may have a pattern width of 0.5 µm to 1 µm.

Forming the opening pattern with such a relatively high aspect ratio and a small pattern width allows the thickness of the insulating film at the bottom portion of the through hole to be further reduced. This can further shorten the etching time for exposing the conductive layer.

The base film may be composed of silicon oxide, and the conductive layer may be composed of an aluminum pad. The insulating film may also be composed of silicon oxide, and the conductive material may be composed of copper.

The semiconductor device manufacturing method may further include the steps of, before forming the through hole, preliminarily forming a stepped portion by forming an opening pattern in the base film, refilling the preliminarily formed opening pattern with a sacrificial layer having an etching selectivity to the base film, and, after forming the sacrificial layer, forming the conductive layer on the base film so as to cover the preliminarily formed opening pattern, in which the step of forming the through hole may include the step of penetrating through the semiconductor substrate and subsequently removing the sacrificial layer to expose the conductive layer selectively through the opening pattern.

In accordance with the method above, even if the stepped portion may be formed preliminarily in the base film before the formation of the conductive layer, embedding the sacrificial layer in the opening pattern before the formation of the conductive layer allows the base film to have a flattened surface. This can prevent the conductive layer from entering the opening pattern, whereby the conductive layer can be formed preferably on the base film.

The sacrificial layer may be composed of polysilicon.

In accordance with the method above, even if the sacrificial layer may partially remain as etching residue after removal of the layer by etching, the electrical connection between the conductive material in the through hole and the conductive layer are not influenced because the sacrificial layer is composed of polysilicon, which has conductivity.

The semiconductor substrate may be composed of silicon.

In accordance with the method above, since both the semiconductor substrate and the sacrificial layer are composed of the same silicon material, the polysilicon sacrificial layer can be removed directly after penetrating through the silicon substrate (semiconductor substrate) without changing the etching gas.

The semiconductor device manufacturing method may further include the steps of, before forming the base film, selectively forming a second film between the semiconductor substrate and the base film so as to have a pattern inverse to the opening pattern, and, after forming the second film, forming the conductive layer at a position opposed to the second film with the base film therebetween, in which the step of forming the through hole may include the step of penetrating through the semiconductor substrate and subsequently etching the base film selectively using the second film as a mask to form the opening pattern in the base film.

In accordance with the method above, since the opening pattern is formed in the base film after the formation of the through hole, the process between the formation of the base film with no opening pattern on the semiconductor substrate and the formation of the through hole (e.g. the formation of the conductive layer, etc.) does not influence the opening pattern. It is therefore possible, in the deposition of the insulating material in the through hole, to keep the stepped portion (opening pattern) close to the original state immediately after the formation.

The step of forming the second film may include the step of forming an embedded insulating film by embedding insulating material selectively in the front surface of the semiconductor substrate.

In accordance with the method above, since the semiconductor substrate can thus have the preliminarily flattened surface, the base film can be formed on the flattened surface. This allows the layer disposed on the base film (e.g. the conductive layer, etc.) to have no or only a small step. It is also possible to employ an established technique such as STI (Shallow Trench Isolation) and thereby to prevent the process from becoming complicated.

Embodiments of the present invention will hereinafter be described in detail with reference to the accompanying drawings.

Figure 2:
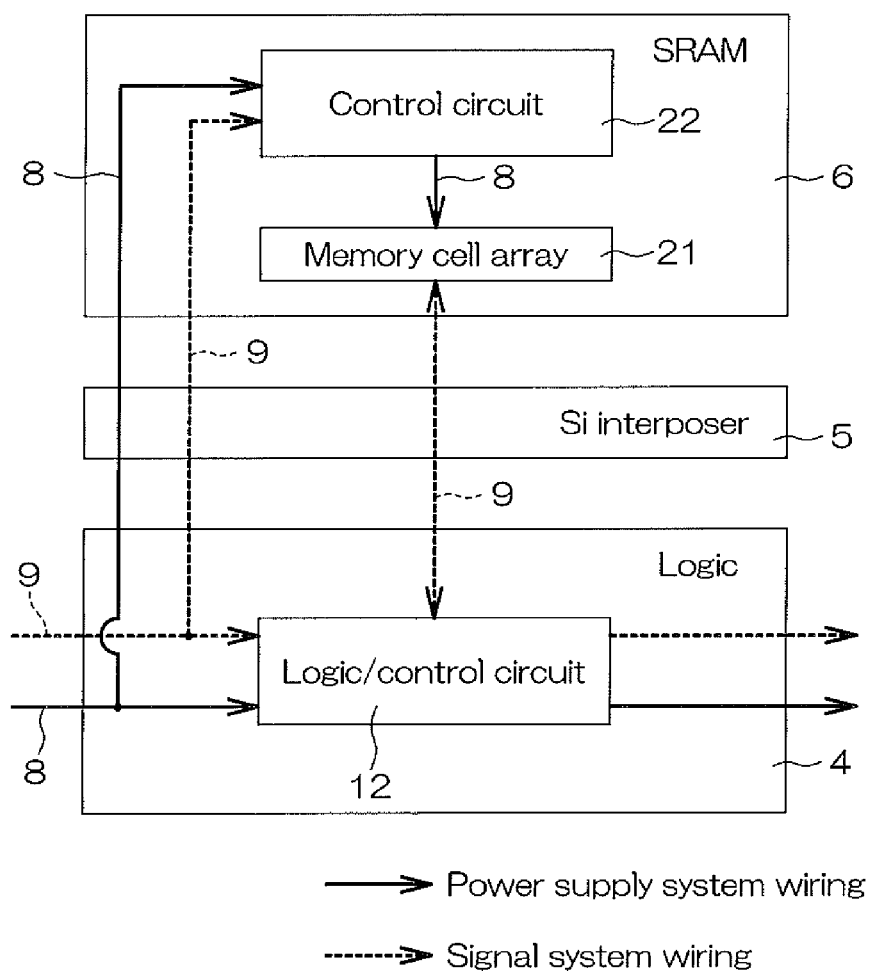
FIG. 2 is a block diagram schematically showing the system configuration of the electronic component shown in FIG. 1.

FIG. 1 is a schematic cross-sectional view of an electronic component 1 according to an embodiment of the present invention. FIG. 2 is a block diagram schematically showing the system configuration of the electronic component 1 shown in FIG. 1.

The electronic component 1 includes a resin interposer 2, an arithmetic chip 4, an Si interposer 5, and a memory chip 6 stacked in this order on a front surface 3 of the resin interposer 2, and a resin package 7. Power supply system wiring 8 and signal system wiring 9 are incorporated in the electronic component 1. It is noted that the arithmetic chip 4, the Si interposer 5, and the memory chip 6 are merely an example of multiple semiconductor devices stacked on the front surface 3 of the resin interposer 2 and not intended to be limited thereto.

The resin interposer 2 is composed of a resin (e.g. epoxy resin) substrate. The arithmetic chip 4, etc., is stacked on the front surface 3 of the resin interposer 2, while multiple external terminals 11 are formed on a rear surface 10 thereof. The resin interposer 2 has a size of 14-mm square, though may be, for example, 0-mm to 15-mm square. The thickness is 0.7 mm, though may be, for example, 0.6 mm to 0.7 mm.

The external terminals 11 are used for electrical connection with lands (electrodes) on a mounting board (printed wiring board). The external terminals 11 are formed in a ball-like shape using metal material such as solder, and arranged in a mutually spaced matrix manner. The external terminals 11 are each connected electrically to a rear surface bump 19 (to be described hereinafter) of the arithmetic chip 4 via a conductive via (not shown) penetrating the resin interposer 2 between the front surface 3 and the rear surface 10 thereof.

In this embodiment, the arithmetic chip 4, the Si interposer 5, and the memory chip 6 are formed to have the same size and stacked in an orderly manner such that the side surfaces are aligned with each other. The chips have a size of 10-mm square, though may be, for example, 6-mm to 10-mm square. The size is smaller than that of the resin interposer 2, and the thickness of the chips is 0.05 mm, though may be, for example, 0.04 mm to 0.06 mm.

Among the multiple semiconductor chips 4 to 6, the arithmetic chip 4 between the uppermost memory chip 6 and the resin interposer 2 as an example of the semiconductor device according to the present invention is incorporated with a logic/control circuit 12 as shown in FIG. 2. The power supply system wiring 8 and the signal system wiring 9 of the electronic component 1 are connected to the logic/control circuit 12. Multiple semiconductor devices such as transistors (e.g. CMOS transistors), diodes, resistors, and capacitors that constitute the logic/control circuit 12 are formed on a front surface 13 of the arithmetic chip 4. That is, the front surface 13 of the arithmetic chip 4 opposed to the memory chip 6 is a device forming surface, and the arithmetic chip 4 is stacked on the resin interposer 2 with the device forming surface 13 facing upward.

The arithmetic chip 4 and the Si interposer 5, which is an example of the semiconductor device according to the present invention, are also formed with multiple through electrodes 17 and 18 penetrating, respectively, between front surfaces 13 and 15 and rear surfaces 14 and 16. Rear surface bumps 19 and 20 are provided one-on-one at the end portions of the respective through electrodes 17 and 18 on the rear surfaces 14 and 16 side. The rear surface bumps 19 and 20 are formed in a ball-like shape using metal material such as solder. The rear surface bumps 19 of the arithmetic chip 4 are also connected electrically to the semiconductor device on the front surface 13.

On the other hand, the uppermost memory chip 6 is incorporated with a memory cell array 21 (SRAM (Static Random Access Memory) cell array in this embodiment) and a control circuit 22. The power supply system wiring 8 and the signal system wiring 9 of the electronic component 1 are connected to the circuits 21 and 22. Specifically, the control circuit 22 is connected to the memory cell array 21 through the power supply system wiring 8, while the memory cell array 21 is connected to the logic/control circuit 12 in the arithmetic chip 4 through the signal system wiring 9. Multiple semiconductor devices such as transistors, diodes, resistors, and capacitors that constitute the memory cell array 21 and the control circuit 22 are formed on a rear surface 23 of the memory chip 6. That is, the rear surface 23 of the memory chip 6 opposed to the arithmetic chip 4 is a device forming surface, and the memory chip 6 is stacked on the resin interposer 2 with the device forming surface 23 facing downward. Multiple rear surface bumps 24 are also provided on the rear surface 23 of the memory chip 6. The rear surface bumps 24 are formed in a ball-like shape using metal material such as solder and connected electrically to the semiconductor device on the rear surface 23.

The rear surface bumps 24 of the memory chip 6 are connected electrically relayed by the through electrodes 18 and the rear surface bumps 20 to the through electrodes 17 and the rear surface bumps 19 of the arithmetic chip 4, which are provided at a pitch different from that of the through electrodes 18 and the rear surface bumps 20. With this arrangement, the multiple stacked semiconductor chips 4 to 6 are connected electrically with each other and to the external terminals 11 of the resin interposer 2.

It is noted that although the arithmetic chip 4 and the memory chip 6 have their respective different terminal pitches, between which the Si interposer 5 is disposed for electrical relaying in this embodiment, the Si interposer 5 may not be provided if the terminal pitches are exactly the same.

The resin package 7 (e.g. epoxy resin) provides sealing only over the front surface 3 side of the resin interposer 2 so that the rear surface 10 of the resin interposer 2 is exposed. Thereby, the entire arithmetic chip 4, the Si interposer 5, and the memory chip 6 are covered so that the chips are not exposed. The side surface of the resin package 7 is also formed in a manner aligned with the side surface of the resin interposer 2.

Figure 3:
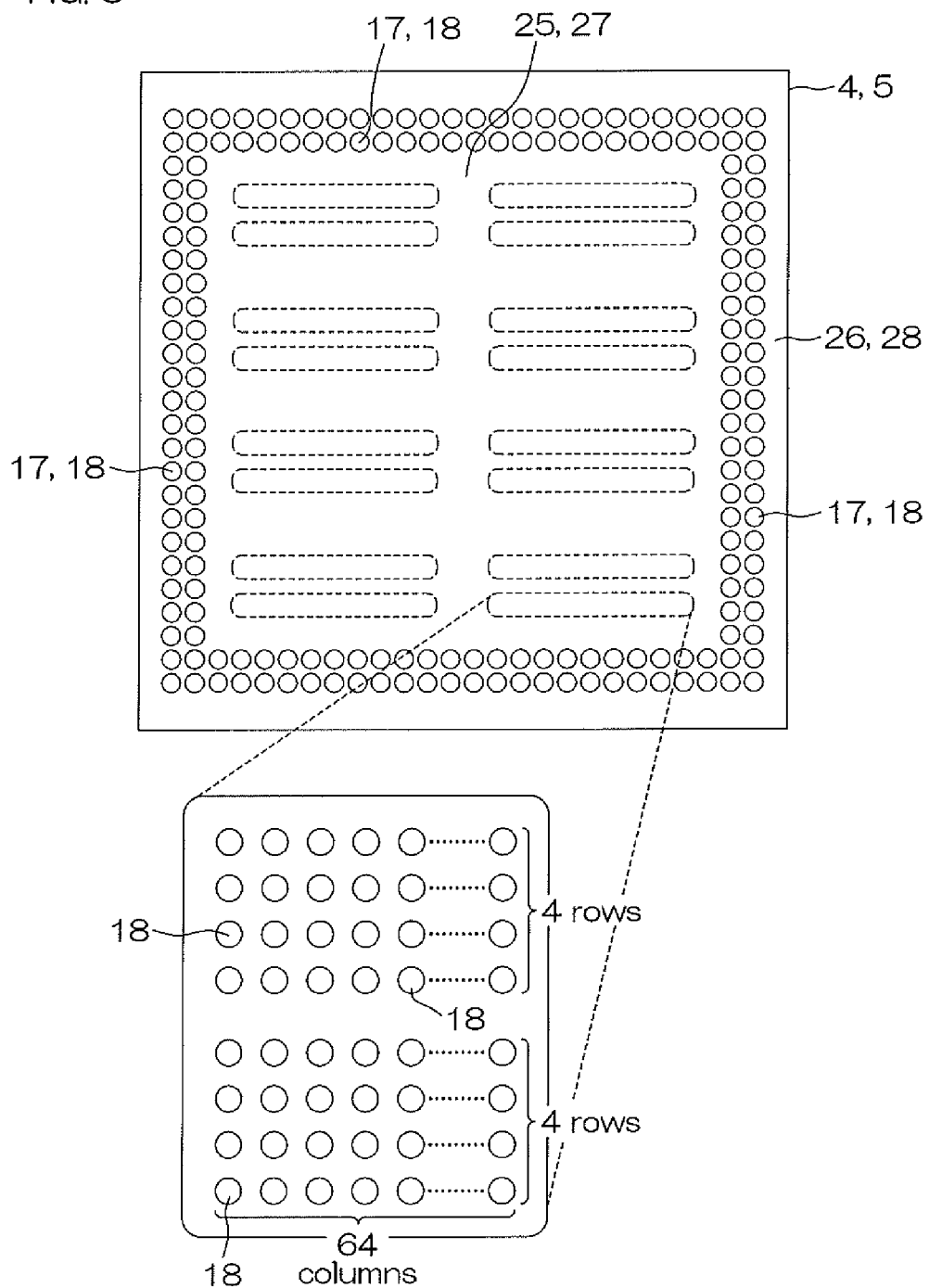
FIG. 3 is a layout chart of the through electrode shown in FIG. 1.

FIG. 3 is a layout chart of the through electrodes 17 and 18 of the Si interposer 5 and the arithmetic chip 4 shown in FIG. 1.

As shown in FIG. 1, among the multiple stacked semiconductor chips 4 to 6, the through electrodes 17 and 18 are provided, respectively, in the arithmetic chip 4 and the Si interposer 5 in this embodiment.

In the arithmetic chip 4, multiple (two in this embodiment) lines of aligned through electrodes 17, for example, are provided annularly along a peripheral portion 26 surrounding a central portion 25 of the arithmetic chip 4. It is noted that the through electrodes 17 of the arithmetic chip 4 may be arranged irregularly and randomly, for example, and provided annularly as a whole along the peripheral portion 26 of the arithmetic chip 4.

This allows the arithmetic chip 4 to transfer electrical power and send electrical signals to the memory chip 6 using the through electrodes 17. That is, the through electrodes 17 of the arithmetic chip 4 define the power supply system wiring 8 and the signal system wiring 9 of the electronic component 1 to transfer electrical power and send signals through the wirings 8 and 9.

On the other hand, in the Si interposer 5, a single line of through electrodes 18, for example, are provided annularly along a peripheral portion 28 surrounding a central portion 27 of the Si interposer 5 (the through electrodes 18 may hereinafter be referred to as through electrodes 18 in the peripheral portion 28). Further, in the Si interposer 5, multiple groups of through electrodes 18, with the multiple through electrodes 18 serving as one group, are arranged in a matrix manner in the central portion 27 surrounded by the peripheral portion 28 (the through electrodes 18 may hereinafter be referred to as through electrodes 18 in the central portion 27).

In this embodiment, the through electrodes 18 in the peripheral portion 28 are arranged immediately above the respective through electrodes 17 of the arithmetic chip 4 so as to be on the same straight line as the respective through electrodes 17 of the arithmetic chip 4.

In each group of the through electrodes 18 in the central portion 27, multiple blocks of through electrodes 18 arranged in a matrix manner are provided, with the multiple through electrodes 18 serving as one block. Specifically, in this embodiment, eight groups are arranged in a 4-by-2 (4×2) matrix manner. In each of the groups, two blocks of 4-by-64 (4×64) through electrodes 18 are provided, that is, 512 through electrodes 18 in total are provided in one group. In the entire Si interposer 5, eight such groups, that is, 4096 (512×8) through electrodes 18 are provided.

This allows the Si interposer 5 to, for example, relay an electrical signal of bits (4096 bits in this embodiment) corresponding to the number of the through electrodes 18 in the central portion 27 between the arithmetic chip 4 (e.g. the logic/control circuit 12) and the memory chip 6 (e.g. the memory cell array 21) using the through electrodes 18 in the central portion 27. That is, the through electrodes 18 in the central portion 27 of the Si interposer 5 define the signal system wiring 9 of the electronic component 1 to allow for bidirectional transfer/reception of electrical signals through the wiring 9. It is noted that the arrangement and number of the through electrodes 18 are merely an example of the present invention, and may be modified appropriately according to the design of the electronic component 1. For example, 256 through electrodes 18 in one block may be arranged in an 8-by-32 (8×32) matrix manner.

The Si interposer 5 can also relay electrical power and electrical signals transferred or sent from the arithmetic chip 4 to the memory chip 6 (e.g. the control circuit 22) using, for example, the through electrodes 18 in the peripheral portion 28. That is, the through electrodes 18 in the peripheral portion 28 of the Si interposer 5 define the power supply system wiring 8 and the signal system wiring 9 of the electronic component 1 to transfer electrical power and send electrical signals through the wirings 8 and 9.

Figure 4:
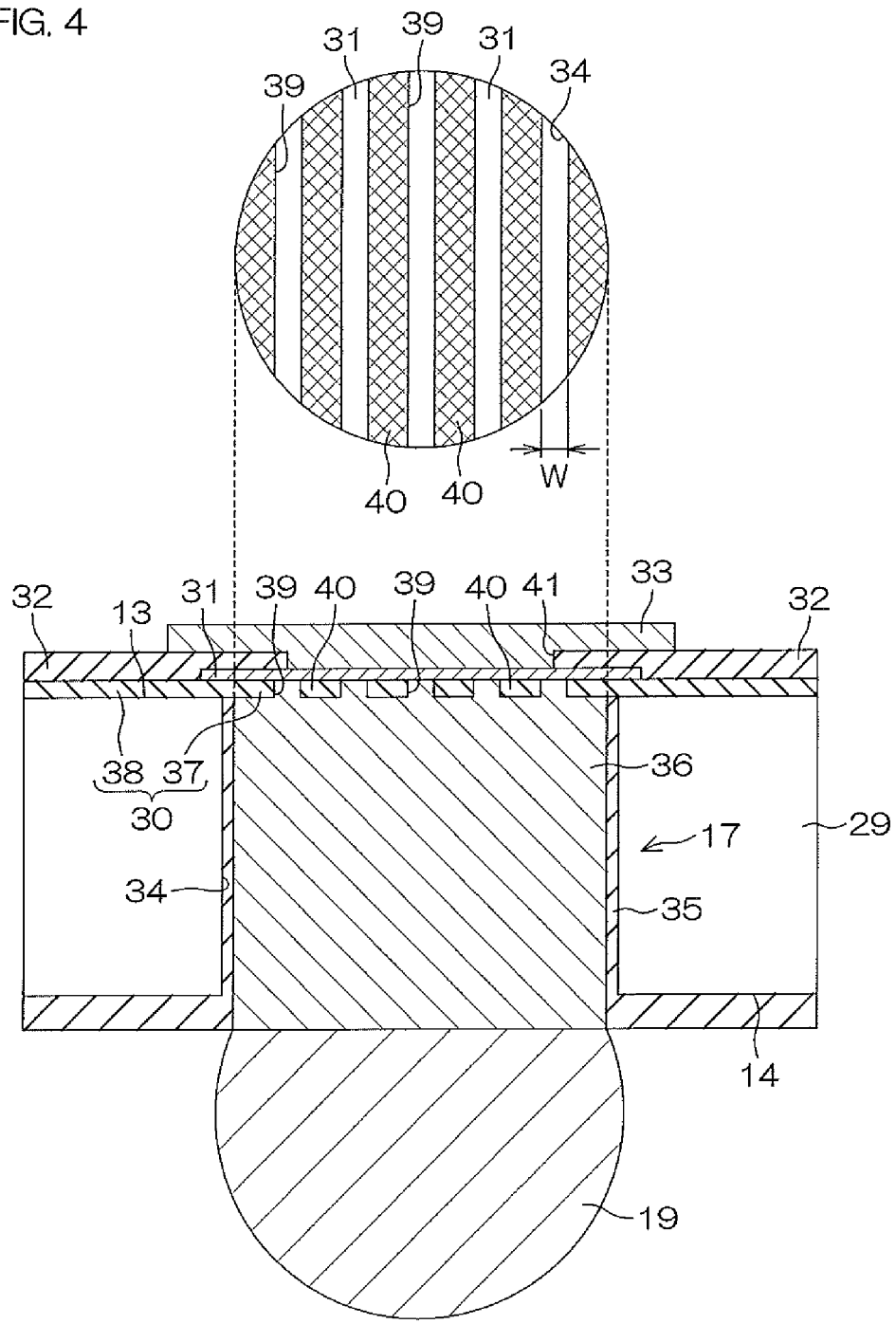
FIG. 4 is a schematic view illustrating the structure of the arithmetic chip (according to a first embodiment) shown in FIG. 1.

FIG. 4 is a schematic cross-sectional view illustrating the structure of the arithmetic chip 4 (according to a first embodiment) shown in FIG. 1, enlarging one of the parts where the through electrodes 17 are provided. In FIG. 4, the upper portion on the paper is a plan view of the bottom portion of the through hole, while the lower portion on the paper is a cross-sectional view of the through electrode 17.

The arithmetic chip 4 includes a silicon substrate 29 as an example of the semiconductor substrate according to the present invention that constitutes a main body of the arithmetic chip 4, the through electrode 17, a base insulating film 30, a front surface pad 31 as an example of the conductive layer according to the present invention, a coverage insulating film 32, a front surface bump 33, and the rear surface bump 19.

The silicon substrate 29 has a thickness of 30 μm to 50 μm, for example. The base insulating film 30 is formed on the front surface (device forming surface) 13 of the silicon substrate 29.

The through electrode 17 includes a through hole 34 penetrating the silicon substrate 29 from the rear surface 14 to the front surface 13, a side wall insulating film 35 formed on the side wall of the through hole 34, and a conductive material 36 embedded inside the side wall insulating film 35 of the through hole 34.

The through hole 34 is formed in a columnar shape penetrating the silicon substrate 29 perpendicularly to the front surface 13. The hole is formed in a circular columnar shape in this embodiment, though may be a circular, triangular, quadrangular, or another polygonal columnar shape.

The side wall insulating film 35 is composed of, for example, silicon oxide ($SiO_2$) and formed at least over the entire side wall of the through hole 34. The side wall insulating film 35 provides insulation between the silicon substrate 29 and the conductive material 36. In this embodiment, the side wall insulating film 35 further has a part formed integrally over the entire rear surface 14 of the silicon substrate 29, and the part on the side wall of the through hole 34 is formed to be thinner than the part on the rear surface 14 of the silicon substrate 29. For example, the part on the side wall has a thickness of about 0.5 μm, while the part on the rear surface 14 has a thickness of about 1 μm.

The base insulating film 30 is composed of, for example, silicon oxide ($SiO_2$) and formed on the front surface 13 of the silicon substrate 29. The front surface pad 31 is disposed on the surface of the base insulating film 30 opposite to that in contact with the front surface 13.

In this embodiment, the base insulating film 30 is formed in a manner closing the opening region (opening end) of the through hole 34. The base insulating film 30 integrally includes a first part 37 arranged in the opening region and a second part 38 arranged outside the opening region (e.g. on the front surface 13), the parts being formed at a uniform thickness. The thickness is, for example, about 0.5 μm.

The front surface pad 31 is formed across between the first part 37 and the second part 38 of the base insulating film 30. That is, the front surface pad 31 is formed across between the inside and outside of the opening region of the through hole 34 so that the peripheral portion thereof lies on the outside of the opening region of the through hole 34.

The first part 37 of the base insulating film 30 is formed with an opening pattern 39 that selectively exposes the front surface pad 31 therethrough into the through hole 34. In this embodiment, the opening pattern 39 is formed in a striped manner with multiple straight lines being arranged in parallel with each other. The stripes are entirely arrayed from one radial end side to the other radial end side of the through hole 34. This causes the front surface pad 31 to be exposed selectively through every opening pattern 39 and a linear stepped portion 40 to be formed between adjacent openings. That is, on the front surface 13 side of the through hole 34 (this may hereinafter be referred to as the bottom portion of the through hole 34), steps with the same thickness as the stepped portion 40 are provided correspondingly to the number of such stepped portions 40 between the top surface of each stepped portion 40 and the surface of the front surface pad 31 exposed through the opening pattern 39.

Each of the opening patterns 39 preferably has a pattern width W of, for example, 0.5 μm to 1 μm and an aspect ratio ((thickness of the stepped portion 40)/(pattern width W of the opening pattern 39)) of, for example, 1 to 2.

It is noted that FIG. 4 shows the case where the opening pattern 39 is formed only within the opening region of the through hole 34, though may be formed across between the inside and outside of the opening region of the through hole 34. The opening pattern 39 may obviously be formed only within the opening region of the through hole 34. Also, the opening pattern 39 is not required to be formed with multiple openings or in a striped manner, but may be formed in a spiral shape or a winding shape of a single curved line or, alternatively, a matrix formed of multiple dots.

The conductive material 36 is embedded inside the side wall insulating film 35 of the through hole 34 to form the through electrode 17. The conductive material 36 is composed of, for example, copper (Cu) and enters the opening pattern 39 at the bottom portion of the through hole 34 to be connected electrically to the front surface pad 31 within the opening pattern 39.

The front surface pad 31 is composed of, for example, aluminum (Al) and, in this embodiment, of an aluminum pad formed in a quadrilateral shape. Specifically, the front surface pad 31 is formed in a square shape with a size of 25.7-μm square (25.7 μm×25.7 μm) (in the case of a design rule of 90 nm). It is noted that the front surface pad 31 may have a rectangular shape or a circular shape.

The coverage insulating film 32 is composed of, for example, silicon nitride (SiN) and formed on the base insulating film 30 in a manner covering the front surface pad 31. The coverage insulating film 32 is formed with an opening 41 that selectively exposes the front surface pad 31 therethrough.

The front surface bump 33 is composed of, for example, a layered structure of copper and tin-silver alloy (Cu/SnAg)

and formed on the coverage insulating film 32 in a manner entering the opening 41. The front surface bump 33 is connected electrically to the front surface pad 31 at the opening 41. The front surface bump 33 is connected with, for example, one of the rear surface bumps 20 of the Si interposer 5 (see FIG. 1) with the Si interposer 5 being stacked on the arithmetic chip 4.

The rear surface bump 19 is provided at the end portion of each through electrode 17 on the rear surface 14 side as mentioned above.

In this embodiment, the above-described arrangement of the arithmetic chip 4 is also employed in the Si interposer 5, which is a semiconductor substrate (silicon substrate) with through electrodes 18 formed therein.

Figure 5A:
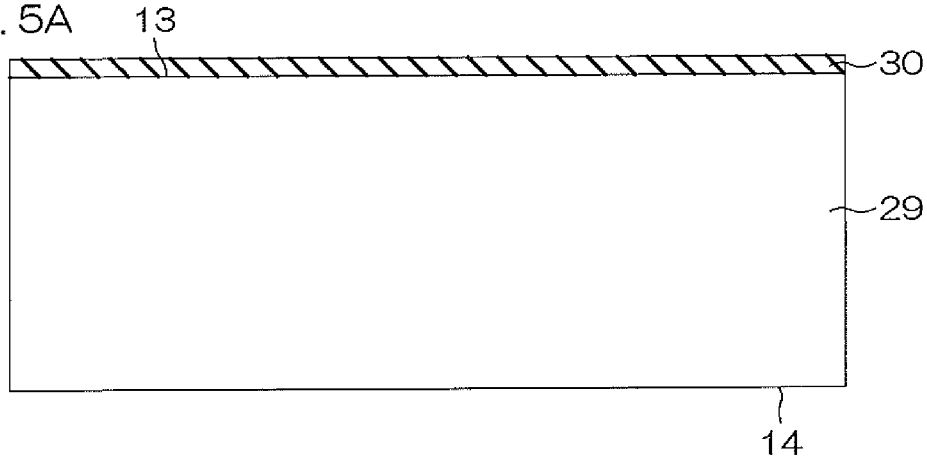
FIGS. 5A to 5N show a sequence of steps of a part of a process for manufacturing the arithmetic chip shown in FIG. 4.
Figure 5B:
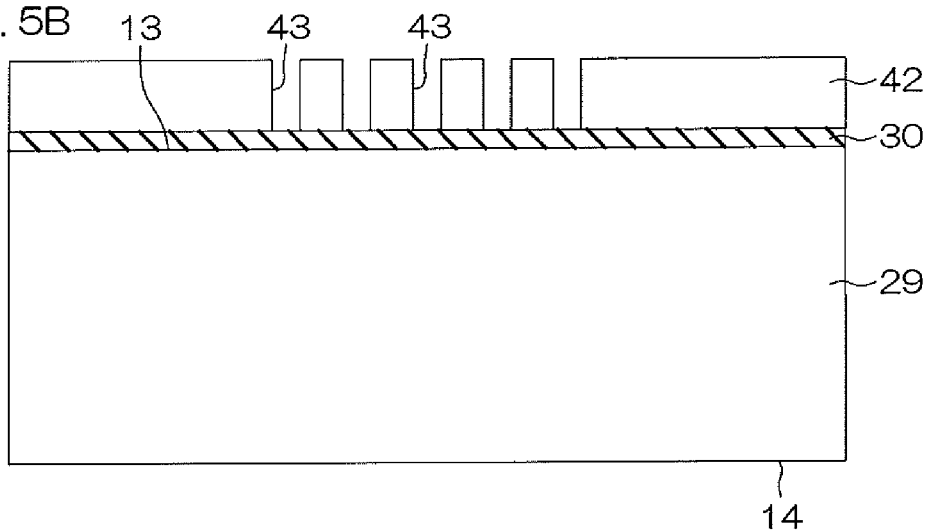
Figure 5C:
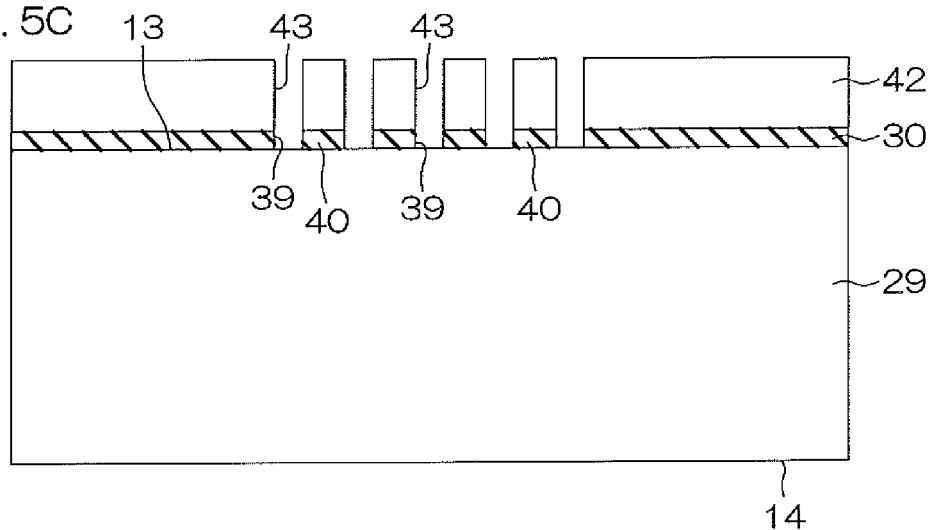
Figure 5D:
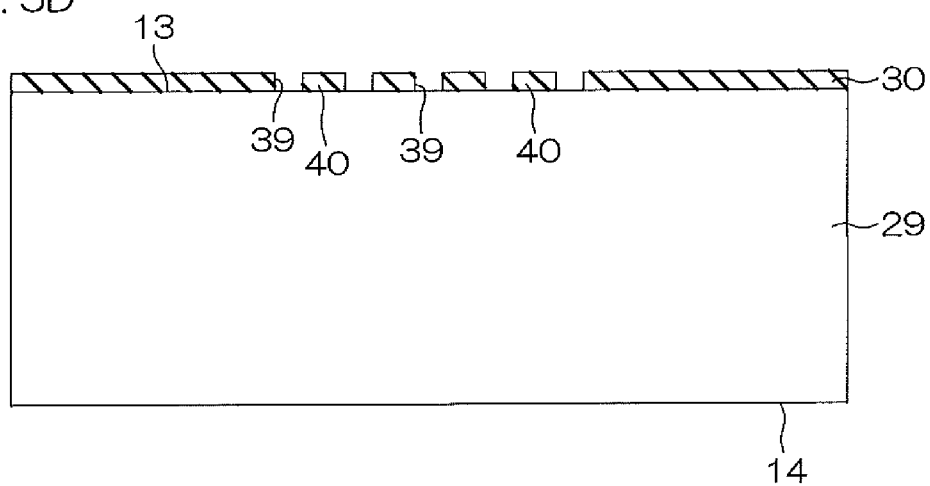
Figure 5E:
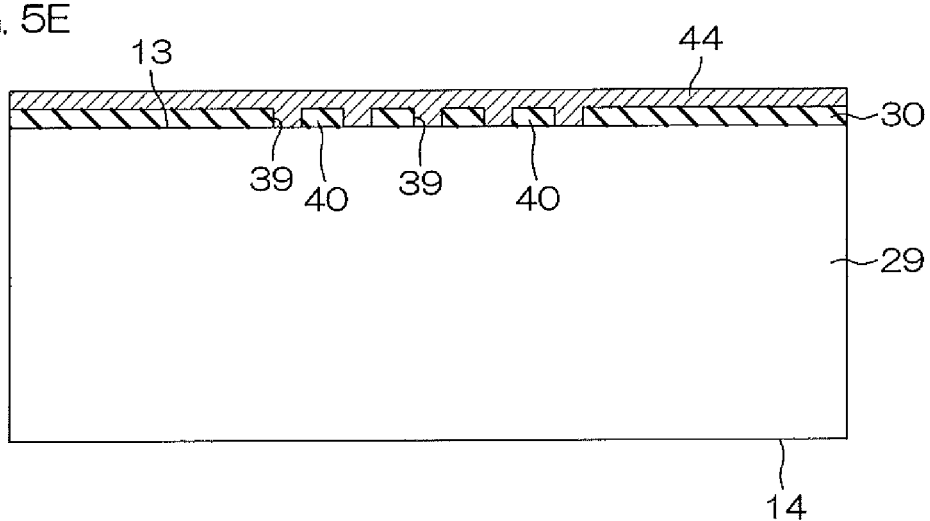
Figure 5F:
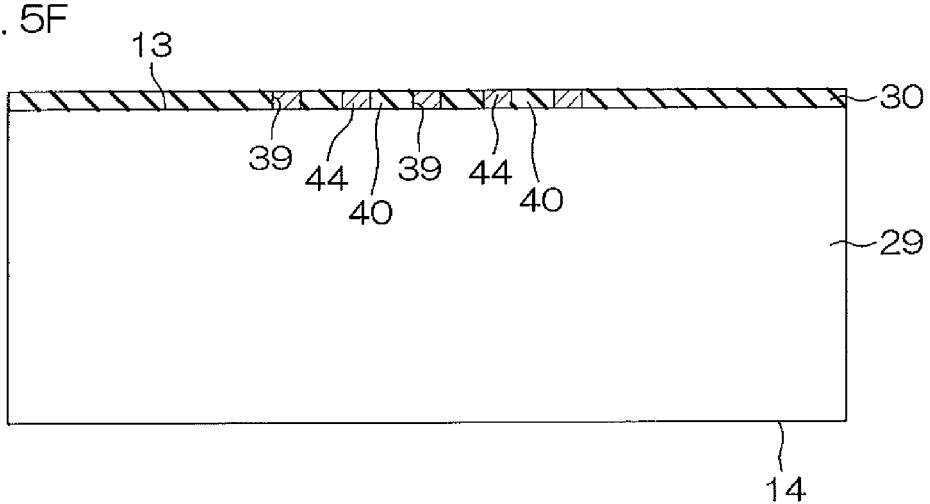
Figure 5G:
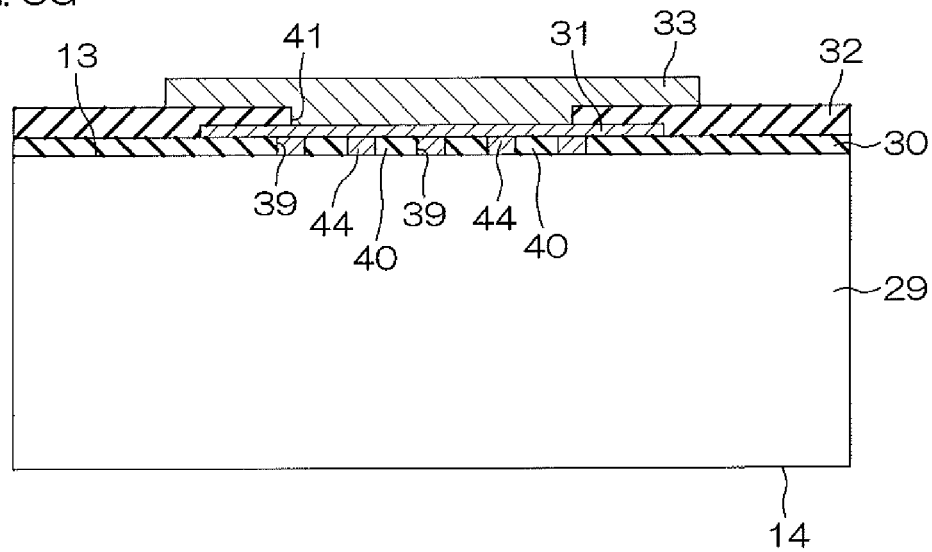
Figure 5H:
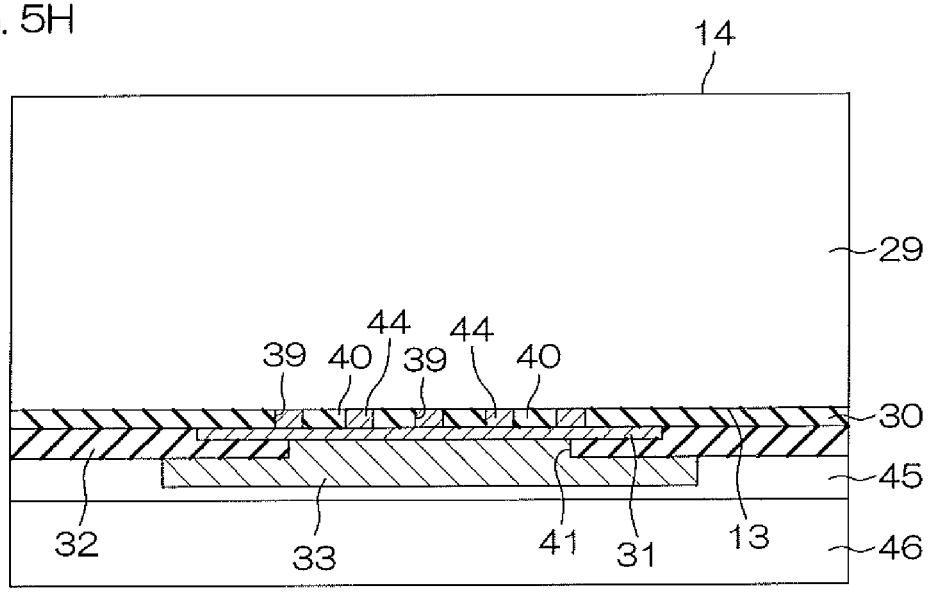
Figure 5:
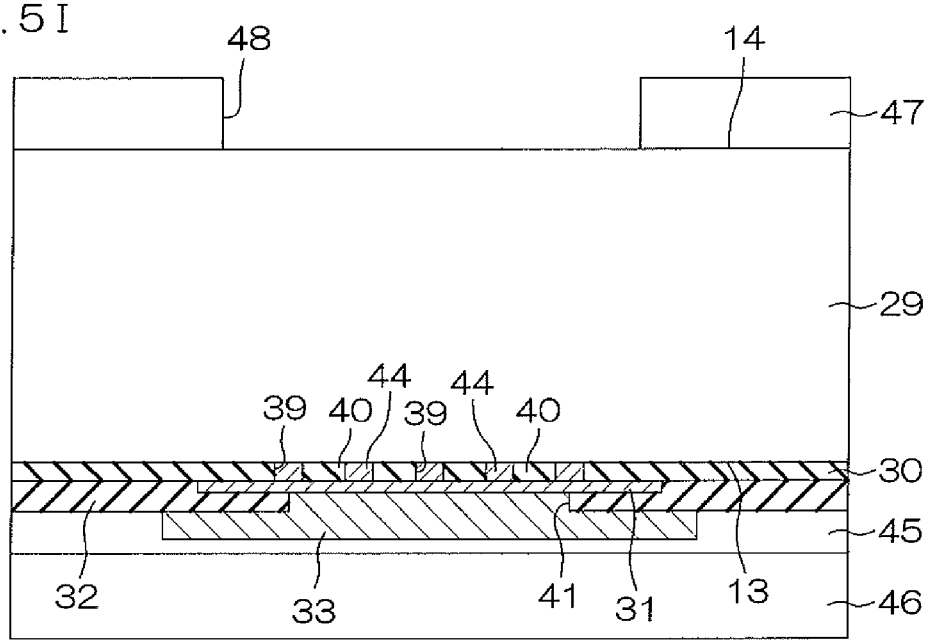
Figure 5J:
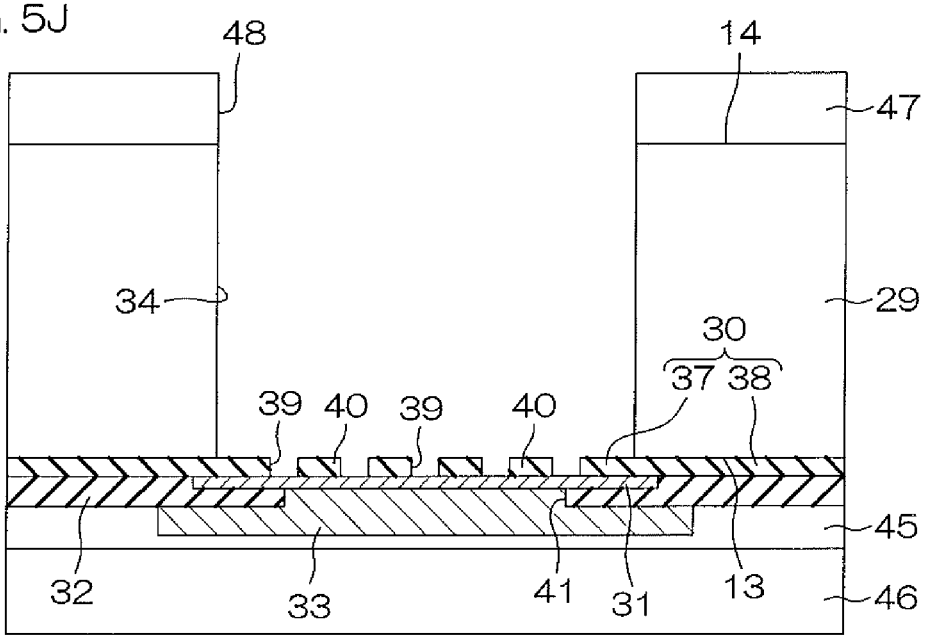
Figure 5K:
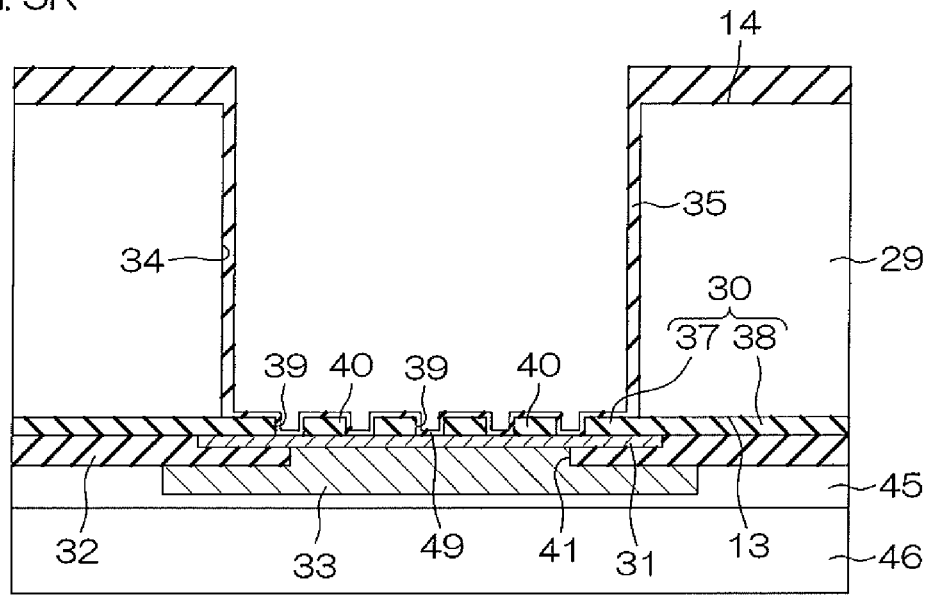
Figure 5L:
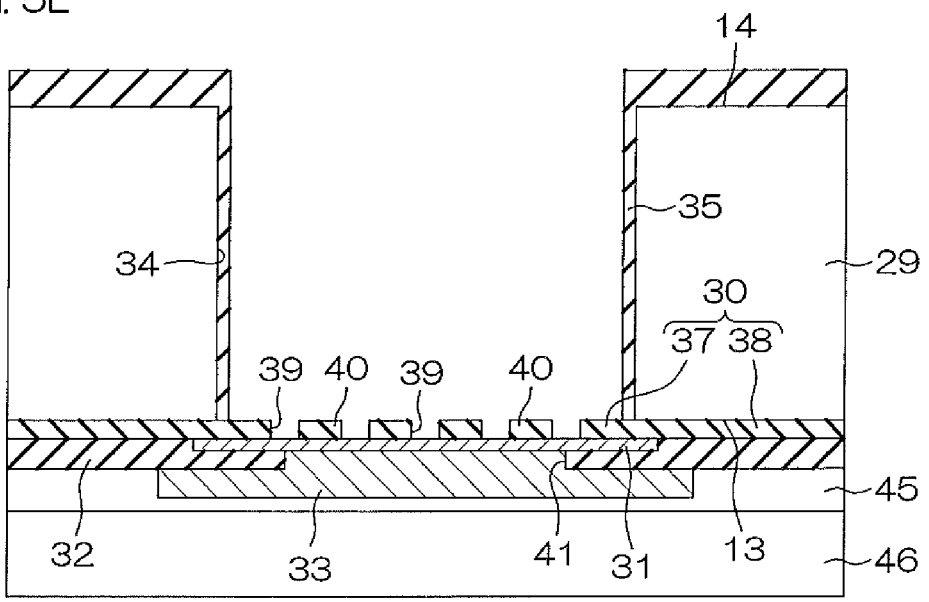
Figure 5M:
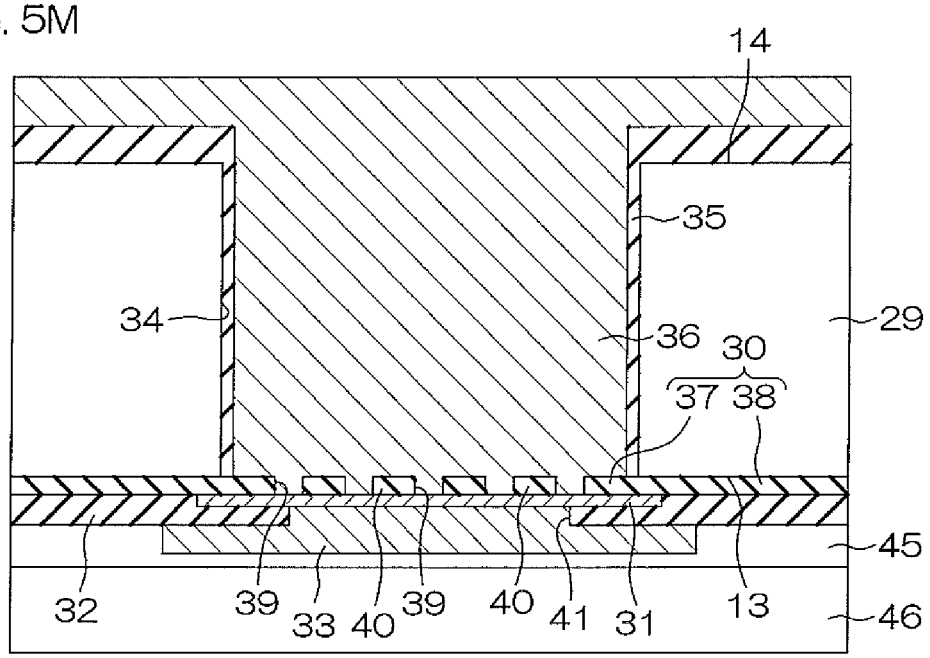
Figure 5N:
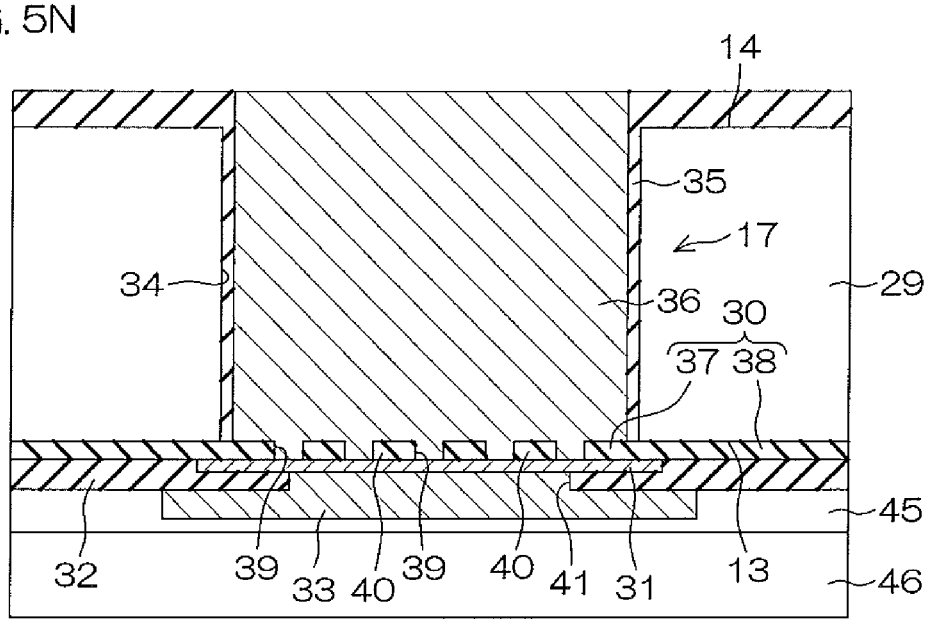

FIGS. 5A to 5N show a sequence of steps of a part of a process for manufacturing the arithmetic chip 4 shown in FIG. 4.

In order to manufacture the arithmetic chip 4 shown in FIG. 4, a CVD method is used to form a base insulating film 30 on a front surface 13 of a silicon substrate 29 as shown in FIG. 5A. The base insulating film 30 may be formed by thermally oxidizing the silicon substrate 29.

Next, as shown in FIG. 5B, a resist mask 42 (e.g. organic resist such as polyimide) with an opening pattern 43 having the same pattern as the opening pattern 39 is formed on the base insulating film 30.

Next, as shown in FIG. 5C, etching gas is supplied via the opening pattern 43 in the resist mask 42, so that the base insulating film 30 is selectively dry-etched. This causes the opening pattern 39 having the same pattern as the opening pattern 43 as well as the stepped portion 40 to be formed in the base insulating film 30. Subsequently, as shown in FIG. 5D, the resist mask 42 is removed.

Next, as shown in FIG. 5E, a CVD method is used to deposit, on the base insulating film 30, material having an etching selectivity to the base insulating film 30. For example, polysilicon may be used for the base insulating film 30 composed of silicon oxide, though not limited thereto. The deposition is continued until the opening pattern 39 is refilled with the polysilicon material and the surface of the base insulating film 30 is covered. This causes a sacrificial layer 44 composed of polysilicon to be formed.

Next, as shown in FIG. 5F, a CMP method is used to selectively remove the parts of the sacrificial layer 44 not embedded in the opening pattern 39. The embedded sacrificial layer 44 cancels the step caused by the stepped portion 40 to apparently flatten the surface of the base insulating film 30.

Next, as shown in FIG. 5G, a known semiconductor device manufacturing technique such as a sputtering method, photolithography, or CVD is used to form a front surface pad 31, a coverage insulating film 32, and a front surface bump 33 in this order. The opening pattern 39 is thus refilled with the sacrificial layer 44 and thereby the surface of the base insulating film 30 is flattened, which can prevent the front surface pad 31 during its formation from entering the opening pattern 39, whereby the front surface pad 31 can be formed preferably on the base insulating film 30.

Next, as shown in FIG. 5H, a glass substrate 46 (support) is bonded to the front surface 13 side of the silicon substrate 29 using adhesive 45.

Next, a grinder, for example, is used to grind (back-grind) the silicon substrate 29 from the rear surface 14 thereof to reduce the thickness of the silicon substrate 29. In this embodiment, the silicon substrate 29, which originally has a thickness of 700 µm or more, is grinded to have a reduced thickness of 30 µm to 50 µm. Next, as shown in FIG. 5I, a resist mask 47 (e.g. organic resist such as polyimide) is formed on the rear surface 14 of the silicon substrate 29. In the resist mask 47, an opening 48 is then formed in a region opposed to the stepped portion 40 (front surface pad 31).

Next, as shown in FIG. 5J, etching gas is supplied via the opening 48 of the resist mask 47 onto the silicon substrate 29 to perform dry etching on the silicon substrate 29 from the rear surface 14 thereof. The etching is continued until the silicon substrate 29 is penetrated and subsequently the sacrificial layer 44 is removed using the same etching gas. When the sacrificial layer 44 is removed, the preliminarily formed opening pattern 39 (stepped portion 40) is formed again at the bottom portion of the through hole 34, and the front surface pad 31 is exposed selectively through the opening pattern 39. Thereafter, the resist mask 47 is removed. Also, a first part 37 and a second part 38 are formed in the base insulating film 30.

Next, as shown in FIG. 5K, a CVD method is used to deposit insulating material (e.g. silicon oxide) in the through hole 34 from the rear surface 14 side of the silicon substrate 29 to thereby form a side wall insulating film 35. During this time, since the stepped portion 40 is formed at the bottom portion of the through hole 34, a thin film part 49 with a thickness (e.g. 0.1 µm to 0.3 µm) smaller than that of the part on the side wall is formed at the bottom portion.

Next, as shown in FIG. 5L, the thin film part 49 at the bottom portion of the through hole 34 is removed selectively through etchback. This causes the front surface pad 31 within the opening pattern 39, which is covered with the thin film part 49, to be exposed. It is noted that what is essentially required in this step is that the front surface pad 31 is exposed to ensure electrical connection between the conductive material 36 and the front surface pad 31, and therefore the thin film part 49 may partially remain on the stepped portion 40, for example, after the step.

Next, as shown in FIG. 5M, a seed film (e.g. a layered film of Ti/Cu) is sputtered on the surface of the side wall insulating film 35 and then undergoes Cu plating growth through electrolytic plating. This causes the inside of the side wall insulating film 35 within the through hole 34 to be filled with Cu, and thus the conductive material 36 is formed that is connected electrically to the front surface pad 31 via the opening pattern 39.

Next, as shown in FIG. 5N, a CMP method is used to remove an unnecessary part (outside the through hole 34) of the conductive material 36 to thereby obtain a through electrode 17.

Thereafter, a rear surface bump 19 is formed on each through electrode 17 and then the silicon substrate 29 is dismounted from the glass substrate 46 to obtain such an arithmetic chip 4 as shown in FIG. 4.

As described heretofore, in accordance with the method of this embodiment, the stepped portion 40 of the base insulating film 30 is formed at the bottom portion of the through hole 34, when insulating material is deposited in the through hole 34 to form the side wall insulating film 35 of the through hole 34 in the step shown in FIG. 5K. As a result, source gas for the insulating material is less likely to enter the opening pattern 39 at the stepped portion 40 at the bottom portion of the through hole 34, whereby the insulating film at the bottom portion can form the thin film part 49 having a thickness smaller than in the case where such a stepped portion 40 is not provided at the bottom portion of the through hole 34.

This can shorten the time required to selectively etch the thin film part 49 at the bottom portion of the through hole 34 to expose the front surface pad 31 through the opening pattern 39 in the step shown in FIG. 5L. Accordingly, the side wall insulating film 35 is less likely to be etched by the etching gas and the film quality is less likely to deteriorate due to etching damage. As a result, the side wall insulating film 35 of the through hole 34 can be prevented from undergoing a reduction in the insulating performance, whereby it is possible to realize a semiconductor device achieving reliability higher than conventional devices.

Further, forming each opening pattern 39 to have a relatively small pattern width W of 0.3 μm to 0.5 μm and a relatively high aspect ratio of 2 to 3 would result in a further reduction in the thickness of the thin film part 49. This could further shorten the etching time in the step shown in FIG. 5L.

Since the sacrificial layer 44 employs polysilicon, which has conductivity, even if the sacrificial layer 44 may partially remain as etching residue after removal of the sacrificial layer 44 by etching in the step shown in FIG. 5J, the electrical connection between the conductive material 36 in the through hole 34 and the front surface pad 31 are not influenced. Further, since both the silicon substrate 29 and the sacrificial layer 44 are composed of the same silicon material, the polysilicon sacrificial layer 44 can be removed directly after penetrating through the silicon substrate 29 without changing the etching gas.

Thus since the arranged arithmetic chip 4 and the Si interposer 5 being mounted in which the side wall insulating film 35 is prevented from undergoing a reduction in the insulating performance, the electronic component 1 shown in FIG. 1 can therefore realize reliability higher than conventional components.

Figure 6:
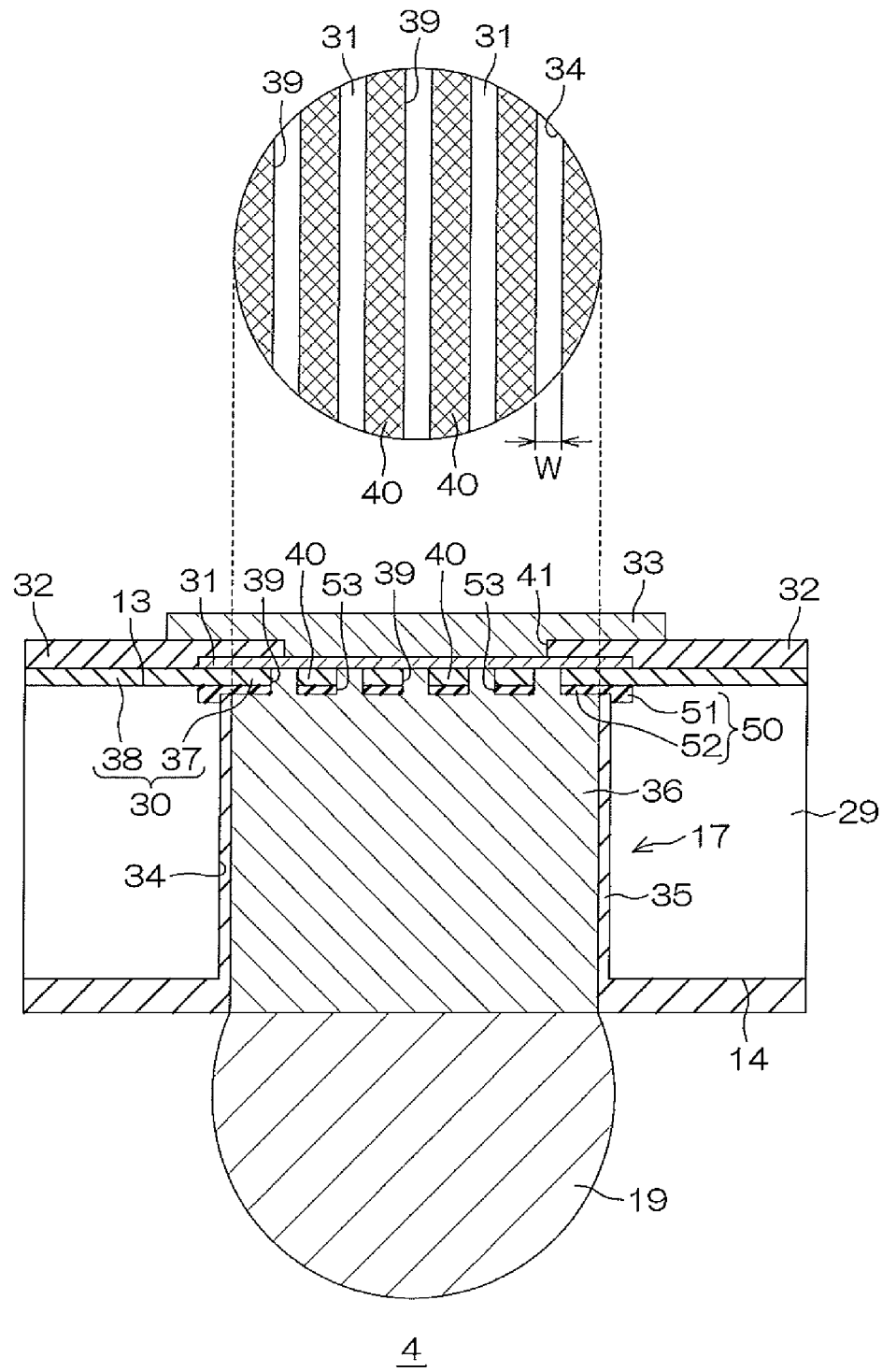
FIG. 6 is a schematic view illustrating the structure of the arithmetic chip (according to a second embodiment) shown in FIG. 1.

FIG. 6 is a schematic cross-sectional view illustrating the structure of the arithmetic chip 4 (according to a second embodiment) shown in FIG. 1, enlarging one of the parts where the through electrodes 17 are provided. It is noted that in FIG. 6, components corresponding to those shown in FIG. 4 are designated by the same reference numerals. The components designated by the same reference numerals will not be described in detail below.

In the arithmetic chip 4 shown in FIG. 6, an embedded insulating film 50 is provided between the silicon substrate 29 and the base insulating film 30 as an example of the second film according to the present invention. The embedded insulating film 50 is embedded selectively in the front surface 13 of the silicon substrate 29.

The embedded insulating film 50 integrally includes an outer edge portion 51 disposed on the outside of the opening region of the through hole 34 in a manner surrounding the through hole 34 and a central portion 52 disposed in the opening region of the through hole 34. The central portion 52 has an opening pattern 53 which is the same as the opening pattern 39 and is stacked selectively on the stepped portion 40.

In this embodiment, the central portion 52 is formed to be thinner than the outer edge portion 51 in the embedded insulating film 50. The central portion 52 is also formed to be thinner than the base insulating film 30.

FIGS. 7A to 7J show a sequence of steps of a part of a process for manufacturing the arithmetic chip shown in FIG. 6.

Figure 7A:
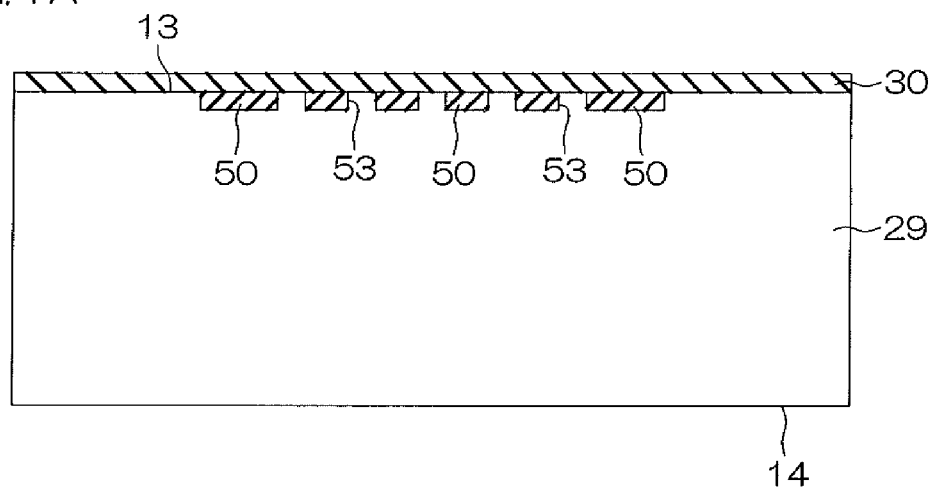

In order to manufacture the arithmetic chip 4 shown in FIG. 6, the silicon substrate 29 is selectively dry-etched from the front surface 13 thereof as shown in FIG. 7A. This causes a shallow trench having the same pattern as the embedded insulating film 50 to be formed. A CVD method is then used to fill the shallow trench with insulating material (e.g. silicon oxide). Next, the silicon oxide outside the shallow trench is removed through CMP to form the embedded insulating film 50 embedded in the silicon substrate 29. This step can be performed through, for example, an STI (Shallow Trench Isolation) process, in conjunction with the step of forming multiple device isolation regions in the silicon substrate 29. As a result, this step can prevent the process from becoming complicated and efficiently form the embedded insulating film 50. Next, a CVD method is used to form a base insulating film 30 on the front surface 13 of the silicon substrate 29 in a manner covering the embedded insulating film 50.

Figure 7B:
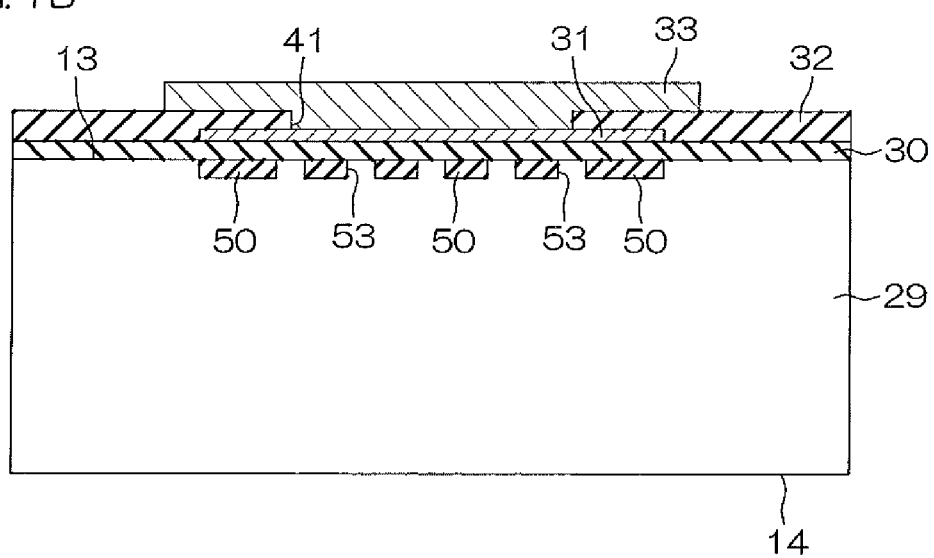

Next, as shown in FIG. 7B, a known semiconductor device manufacturing technique such as a sputtering method, photolithography, or CVD is used to form a front surface pad 31, a coverage insulating film 32, and a front surface bump 33 in this order at the position opposed to the embedded insulating film 50 with the base insulating film 30 therebetween. Since an insulating film under the base insulating film 30 is the embedded insulating film 50 and the surface of the base insulating film 30 is flattened, the front surface pad 31 can be formed preferably on the base insulating film 30. This allows the front surface pad 31, the coverage insulating film 32, and the front surface bump 33 disposed on the base insulating film 30 to have no or only a small step.

Figure 7C:
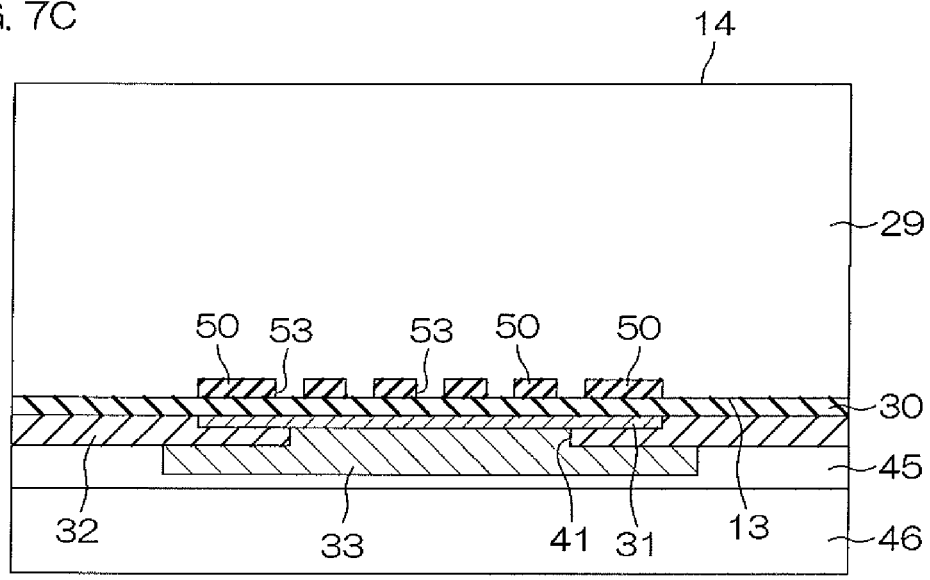

Next, as shown in FIG. 7C, a glass substrate 46 (support) is bonded to the front surface 13 side of the silicon substrate 29 using adhesive 45.

Figure 7D:
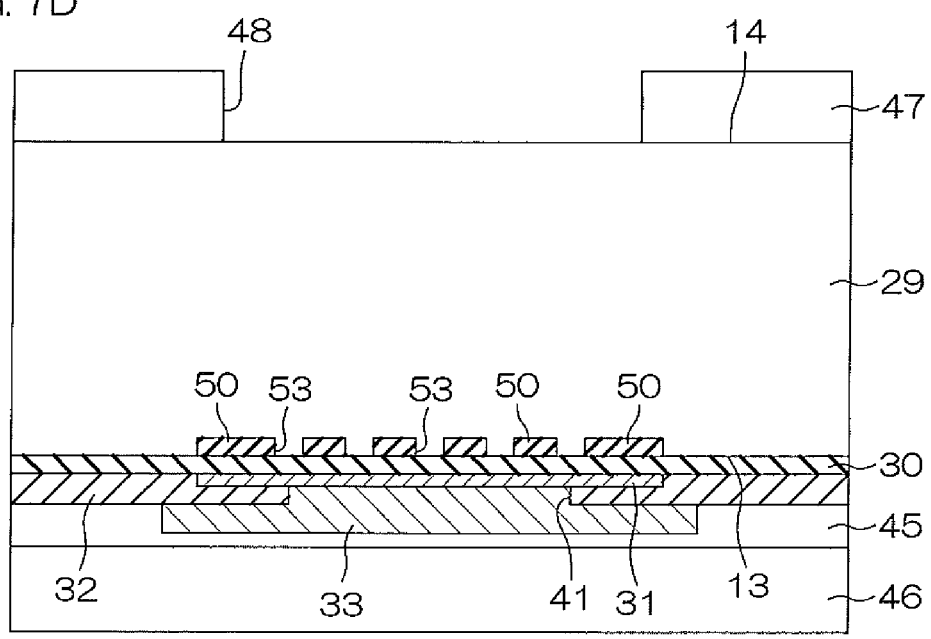

Next, a grinder, for example, is used to grind (back-grind) the silicon substrate 29 from the rear surface 14 thereof to reduce the thickness of the silicon substrate 29. In this embodiment, the silicon substrate 29, which originally has a thickness of 700 μm or more, is grinded to have a reduced thickness of 30 μm to 50 μm. Next, as shown in FIG. 7D, a resist mask 47 (e.g. organic resist such as polyimide) is formed on the rear surface 14 of the silicon substrate 29. In the resist mask 47, an opening 48 is then formed in a region opposed to the embedded insulating film 50.

Next, as shown in FIG. 7E, etching gas is supplied via the opening 48 of the resist mask 47 onto the silicon substrate 29 to perform dry etching on the silicon substrate 29 from the rear surface 14 thereof. The etching is continued until the silicon substrate 29 is penetrated to reach the base insulating film 30. This causes the opening pattern 53 of the embedded insulating film 50 to be exposed to the through hole 43. An outer edge portion 51 and a central portion 52 are also formed in the embedded insulating film 50.

Next, as shown in FIG. 7F, etching gas is supplied via the opening pattern 53 of the embedded insulating film 50 to selectively dry-etch the base insulating film 30. This causes an opening pattern 39 having the same pattern as the opening pattern 53 as well as a stepped portion 40 to be formed in the base insulating film 30, so that the front surface pad 31 is exposed selectively through the opening pattern 39. A first part 37 and a second part 38 are also formed in the base insulating film 30. During this time, the central portion 52 of the embedded insulating film 50, which lies within the through hole 34, is only exposed to the etching gas to be etched and thereby to have a thickness smaller than that of the outer edge portion 51. It is noted that the central portion 52 may be removed completely by the etching.

Figure 7G:
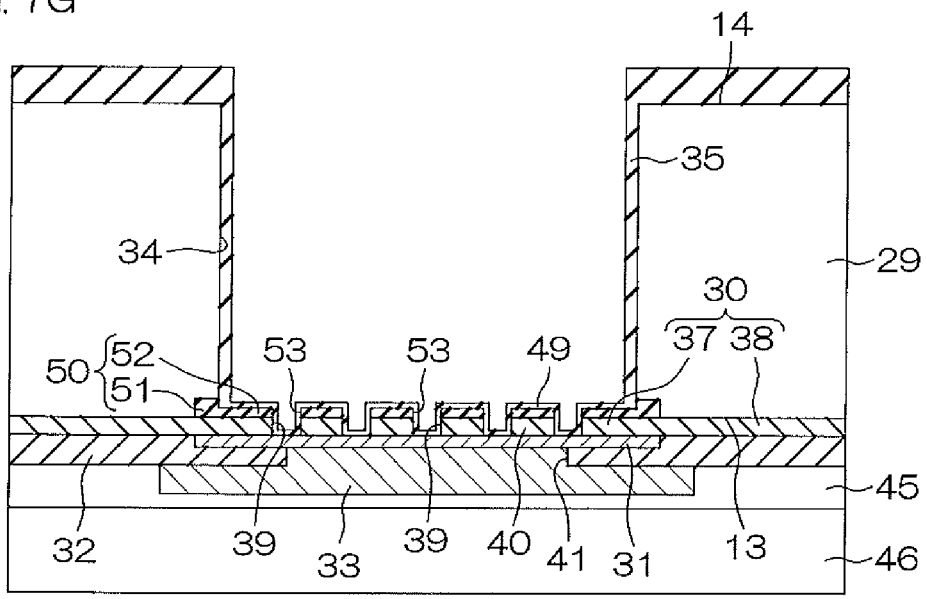

Next, as shown in FIG. 7G, a CVD method is used to deposit insulating material (e.g. silicon oxide) in the through hole 34 from the rear surface 14 side of the silicon substrate 29 to thereby form a side wall insulating film 35. During this time, since the stepped portion 40 is formed at the bottom portion of the through hole 34, a thin film part 49 with a thickness (e.g. 0.1 μm to 0.3 μm) smaller than that of the part on the side wall is formed at the bottom portion.

Figure 7H:
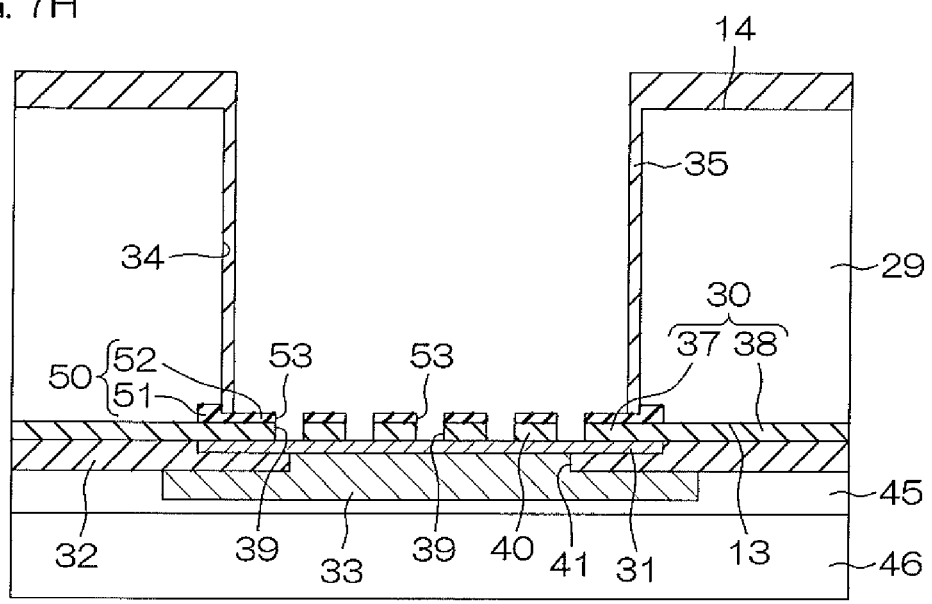

Next, as shown in FIG. 7H, the thin film part 49 at the bottom portion of the through hole 34 is removed selectively through etchback. This causes the front surface pad 31 within the opening pattern 39, which is covered with the thin film part 49, to be exposed. It is noted that what is essentially required in this step is that the front surface pad 31 is exposed to ensure electrical connection between the conductive material 36 and the front surface pad 31, and therefore the thin film part 49 may partially remain on the stepped portion 40, for example, after the step.

Figure 7I:
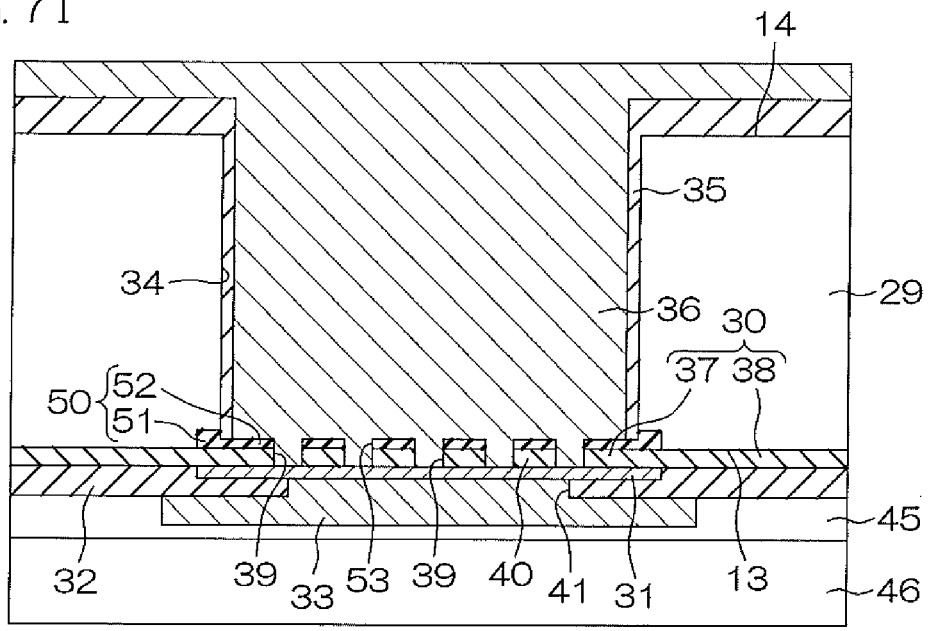

Next, as shown in FIG. 7I, a seed film (e.g. a layered film of Ti/Cu) is sputtered on the surface of the side wall insulating film 35 and then undergoes Cu plating growth through electrolytic plating from the seed film from the seed film. This causes the inside of the side wall insulating film 35 within the through hole 34 to be filled with Cu, and thus the conductive material 36 is formed that is connected electrically to the front surface pad 31 via the opening pattern 39.

Figure 7J:
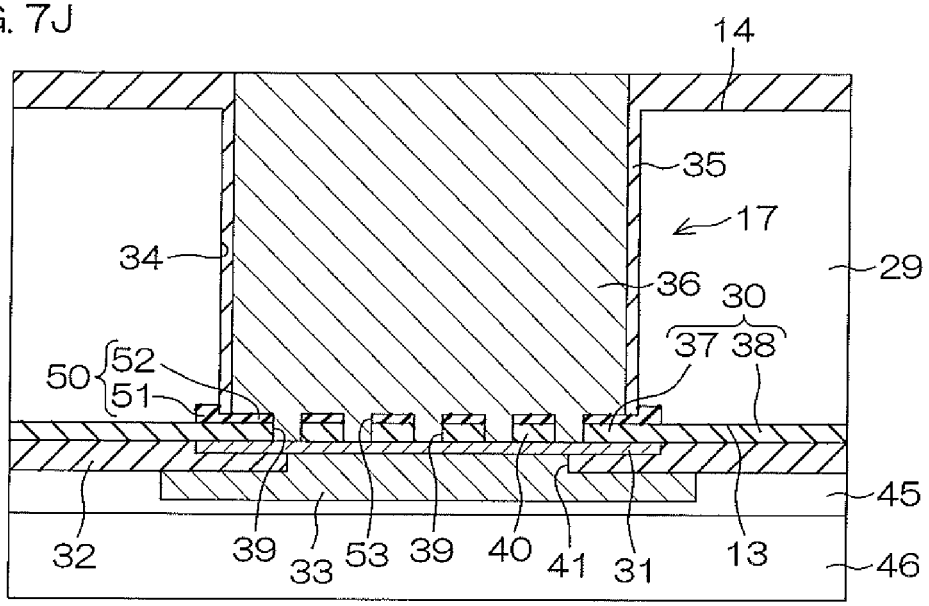

Next, as shown in FIG. 7J, a CMP method is used to remove an unnecessary part (outside the through hole 34) of the conductive material 36 to thereby obtain a through electrode 17.

Thereafter, a rear surface bump 19 is formed on each through electrode 17 and then the silicon substrate 29 is dismounted from the glass substrate 46 to obtain such an arithmetic chip 4 as shown in FIG. 6.

As described heretofore, in accordance with the method of this embodiment, since the opening pattern 39 is formed in the base insulating film 30 after the formation of the through hole 34 as shown in FIGS. 7E and 7F, the process between the formation of the base insulating film 30 without such an opening pattern 39 on the silicon substrate 29 and the formation of the through hole 34 (e.g. the steps shown in FIGS. 7A to 7D, etc.) does not influence the opening pattern 39. It is therefore possible, in the deposition of the insulating material in the through hole 34 as shown in FIG. 7G, to keep the stepped portion 40 (opening pattern 39) close to the original state immediately after the formation. It is obvious that this embodiment can also realize the same effects as the first embodiment.

Although the embodiments of the present invention have heretofore been described, the present invention may be embodied in other forms.

For example, in the second embodiment, the film provided between the silicon substrate 29 and the base insulating film 30 may not necessarily be embedded in the silicon substrate 29, but may be formed on the front surface 13 of the silicon substrate 29, for example.

The embodiments of the present invention are merely specific examples used to clarify the technical details of the present invention. The present invention should not be construed as limited to these specific examples, and the spirit and scope of the present invention is limited only by the appended claims.

The invention claimed is:

1. A semiconductor device comprising:
    a semiconductor substrate;
    a through hole penetrating the semiconductor substrate;
    a base film covering the through hole;
    a conductive layer disposed on the base film;
    a bump electrode disposed on the conductive layer;
    an insulating film formed on the side wall of the through hole; and
    a conductive material embedded in the through hole via the insulating film;
    wherein the base film is formed between the inside and the outside of the through hole;
    wherein the base film has a stepped portion formed by an opening pattern that selectively exposes the conductive layer therethrough into the through hole;
    wherein the base film has a portion disposed between the semiconductor substrate and the bump electrode and substantially preventing electrical conduction between the semiconductor substrate and the bump electrode; and
    wherein the conductive material is connected electrically to the conductive layer via the opening pattern.

2. The semiconductor device according to claim 1, wherein the opening pattern is formed with a plurality of openings.

3. The semiconductor device according to claim 1, further comprising a second film provided between the semiconductor substrate and the base film and having an opening pattern in communication with the opening pattern of the base film.

4. The semiconductor device according to claim 3, wherein the second film is thinner than the base film.

5. The semiconductor device according to claim 3, further comprising an embedded insulating film embedded selectively in a surface of the semiconductor substrate and formed integrally with the second film.

6. The semiconductor device according to claim 1, wherein the opening pattern is formed in a striped manner in the base film.

7. The semiconductor device according to claim 1, wherein the opening pattern in the base film has an aspect ratio of 1 to 3.

8. The semiconductor device according to claim 1, wherein the opening pattern in the base film has a pattern width of between 0.5 μm and 1 μm.

9. The semiconductor device according to claim 1, wherein the base film is composed of silicon oxide.

10. The semiconductor device according to claim 1, wherein the conductive layer is composed of an aluminum pad.

11. The semiconductor device according to claim 1, wherein the insulating film is composed of silicon oxide.

12. The semiconductor device according to claim 1, wherein the conductive material is composed of copper.

* * * * *